United States Patent
Ji et al.

(10) Patent No.: US 11,419,214 B2
(45) Date of Patent: Aug. 16, 2022

(54) POWER SUPPLY MODULE USED IN A SMART TERMINAL AND POWER SUPPLY MODULE ASSEMBLY STRUCTURE

(71) Applicant: Delta Electronics (Shanghai) CO., LTD, Shanghai (CN)

(72) Inventors: Pengkai Ji, Shanghai (CN); Jianhong Zeng, Shanghai (CN); Yu Zhang, Shanghai (CN); Shouyu Hong, Shanghai (CN); Jinping Zhou, Shanghai (CN); Bau-Ru Lu, Shanghai (CN)

(73) Assignee: Delta Electronics (Shanghai) CO., LTD, Shanghai (CN)

( * ) Notice: Subject to any disclaimer, the term of this patent is extended or adjusted under 35 U.S.C. 154(b) by 0 days.

(21) Appl. No.: 17/083,306

(22) Filed: Oct. 29, 2020

(65) Prior Publication Data
US 2021/0045243 A1 Feb. 11, 2021

Related U.S. Application Data

(63) Continuation of application No. 16/261,679, filed on Jan. 30, 2019, now Pat. No. 10,856,417.

(30) Foreign Application Priority Data

Feb. 9, 2018 (CN) .......................... 201810131380.0

(51) Int. Cl.
*H05K 1/00* (2006.01)
*H05K 1/14* (2006.01)
(Continued)

(52) U.S. Cl.
CPC ........... *H05K 1/142* (2013.01); *H05K 1/0216* (2013.01); *H05K 1/117* (2013.01); *H05K 1/181* (2013.01);
(Continued)

(58) Field of Classification Search
CPC ........ H05K 1/142; H05K 1/181; H05K 1/117; H05K 1/0216; H05K 2201/048;
(Continued)

(56) References Cited

U.S. PATENT DOCUMENTS 4,616,655 A * 10/1986 Weinberg ............... H05K 1/141
607/2
6,418,030 B1 * 7/2002 Yamaguchi ............. H01L 23/24
257/698
(Continued)

FOREIGN PATENT DOCUMENTS

| CN | 101018446 A | 8/2007 |
|---|---|---|
| CN | 102969292 A | 3/2013 |

(Continued)

OTHER PUBLICATIONS

Du et al. (CN104661431 A1 English Translation) (Year: 2015).*
(Continued)

*Primary Examiner* — Pete T Lee
(74) *Attorney, Agent, or Firm* — Qinghong Xu

(57) ABSTRACT

The present disclosure provides a power supply module used in a smart terminal and a power supply module assembly structure, the power supply module includes a substrate having first and second surfaces opposite to each other; a power passive element, an active element and a plurality of first conductive parts disposed at the substrate; the power passive element being independently disposed on the first surface of the substrate as a whole; wherein a maximum height of the power passive element disposed on the first surface of the substrate is greater than a sum of a maximum height of an element disposed on the second surface of the substrate and an half of the thickness of the substrate.

13 Claims, 35 Drawing Sheets

(51) Int. Cl.
*H05K 1/18* (2006.01)
*H05K 1/11* (2006.01)
*H05K 1/02* (2006.01)
*H02M 3/158* (2006.01)
*H02M 3/07* (2006.01)
*H02M 3/335* (2006.01)

(52) U.S. Cl.
CPC .............. *H02M 3/07* (2013.01); *H02M 3/158* (2013.01); *H02M 3/33576* (2013.01); *H05K 2201/048* (2013.01); *H05K 2201/09036* (2013.01); *H05K 2201/09045* (2013.01); *H05K 2201/1003* (2013.01); *H05K 2201/10015* (2013.01); *H05K 2201/10037* (2013.01); *H05K 2201/10545* (2013.01)

(58) Field of Classification Search
CPC .......... H05K 2201/10545; H05K 2201/09045; H05K 2201/09036; H05K 2201/10015; H05K 2201/1003; H05K 2201/10037; H05K 3/403; H05K 2201/09845; H05K 2201/09154; H05K 1/141; H05K 1/183; H05K 7/023; H02M 3/158; H02M 3/07; H02M 3/33576; H02M 3/003
See application file for complete search history.

(56) References Cited

U.S. PATENT DOCUMENTS

| | | | | |
|---|---|---|---|---|
| 7,102,892 B2* | 9/2006 | Kledzik | .............. | H01L 25/0652 257/686 |
| 8,644,030 B2* | 2/2014 | Gibbons | ................. | H01L 24/83 361/764 |
| 10,548,249 B2* | 1/2020 | Mokler | .................. | H05K 3/341 |
| 2002/0053723 A1* | 5/2002 | Matsuura | ................ | H01L 23/13 257/678 |
| 2017/0311448 A1* | 10/2017 | Kawabata | ............. | H01F 1/0306 |
| 2019/0037700 A1* | 1/2019 | Tange | .................. | H05K 7/1432 |

FOREIGN PATENT DOCUMENTS

| CN | 104661431 A | 5/2015 |
| CN | 206061373 U | 3/2017 |
| JP | WO2017183384 | * 10/2017 |

OTHER PUBLICATIONS

The 1st Office Action dated Jan. 26, 2021 by the CNIPA.
The Notice of Allowance dated Sep. 3, 2021 for CN patent application No. 201810131380.0.

* cited by examiner

POWER SUPPLY MODULE USED IN A SMART TERMINAL AND POWER SUPPLY MODULE ASSEMBLY STRUCTURE

CROSS-REFERENCE TO RELATED APPLICATIONS

This application is a continuation application of U.S. application Ser. No. 16/261,679, filed on Jan. 30, 2019, and claims priority to Chinese Patent Application 201810131380.0, filed on Feb. 9, 2018, the entire contents thereof are incorporated herein by reference.

TECHNICAL FIELD

The present disclosure relates to an electronic power technical field, particularly to a power module for a smart terminal and a power module assembling structure.

BACKGROUND

Recently, the cloud computing, network technology and various smart terminal (or called intelligent terminal) develop rapidly, in particular, the smart terminal markets, such as mobile phones and IPADs which's markets are huge in scale and are growing rapidly. Wherein, switching power supply is generally used in above mentioned applications to ensure conversion efficiency of a power supply system. However, the integration of the switching power supply is often not high enough due to its complicated circuit, which limits the wide application of the switching power supply in such type of devices.

In order to solve the above mentioned problem, a power supply module is provided. The existing power supply modules are generally soldered to a system board by means of a surface mounted technology (SMT) and/or a dual in-line package (DIP), and are generally mounted directly on upper side of the system PCB or lower side of the system PCB.

However, it is difficult to greatly increase a height of the power supply module to increase the power with the limited upper or lower space of the system PCB. Specially, in applications of the smart terminals, such as mobile phones, the requirements for space and height are extremely stringent, almost no space to increase the height of the power supply module. For example, FIG. 1A shows a cross-sectional view of a typical mobile phone. A battery 100 and a system PCB board 200 on one side of the battery are provided within a housing of the mobile phone. The system PCB board 200 is provided with discrete elements or a power supply module 300. The upper and lower spaces of the system PCB board 200 of the mobile phone are very compact, with only about 1.2 mm for other devices. Thus, in this application, the power supply module is made thinner usually at an expense of reducing the power supply module efficiency or increasing area occupied by the power supply module. Therefore, it is difficult to promote the power of the power module to a greater extent in single-side space of the system PCB board of the mobile phone, to meet diversified needs of smart terminals. And with the large number of crowded devices, the smart terminal faces more challenges from electromagnetic shielding and heat dissipation.

In addition, the power supply module in related art is equipped with electronic elements mounted on one side of the substrate, and introduces pins on the other side of the substrate to be connected with the system PCB. Since the mounted electronic elements on the one side of the substrate are discrete, there is no larger plane for picking in the surface mounted process, which is disadvantageous for assembling.

As shown in FIG. 1B, a magnetic core 600 of the inductor includes upper and lower portions. And the magnetic cores 600 with the upper and lower portions are assembled by passing through a slot formed in the module PCB 500, and a wire in the module PCB 500 is taken as a winding, to form an inductor in the power supply module. The power supply module is mounted on the system PCB 400 and the lower portions of the magnetic cores 600 is placed into the opening of the system PCB 400 to reduce the overall height. However, under an application with similar height on both upper side and lower side of the system PCB 400, this layout causes the space on upper surface of the system PCB 400 to be tight, and the space on the lower surface to be redundant, which result in low space utilization.

Besides, due to the slot of the module PCB 500 to assemble the magnetic core 600, the utilization rate of the module PCB 500 is not high. Further, the design of the magnetic core 600 with the upper and lower portions, and windings in the module PCB 500, makes the magnetic interference is more discrete, which is disadvantageous to the process of the EMI.

With the rapid development of the cloud computing, the network technology and the various smart terminals, the requirements for the power supply module in this applications are more and more strict. Particularly in the application of smart terminals, the upper and lower spaces are similar and very compact, so when design the power supply module with high power, the problem of EMC and electromagnetic shielding, heat dissipation, and SMT grabbing should be also considered.

As above described, in the space where the upper and lower spaces of the system board of the smart terminal are very narrow, how to increase the power of the power supply module without increase the space is a technical bottleneck and a technical problem to be solved in the art.

SUMMARY

To achieve the above object, the present disclosure provides a power supply module, which includes a substrate having first and second surfaces opposite to each other. The substrate is provided with an active element, a power passive element and a plurality of first conductive parts. The power passive element is independently disposed on the first surface of the substrate as a whole. A maximum height of a power passive element disposed on the first surface of the substrate is greater than a sum of a maximum height of an element disposed on the second surface of the substrate and one-half of the thickness of the substance, wherein the power passive element is arranged between a first part of the first conductive parts and a second part of the first conductive parts. Wherein the first conductive parts are disposed at at least two sides of the substrate; or wherein the opposite edges of the first surface of the substrate are provided with a first recessed portion respectively, and the first conductive parts are disposed at the first recessed portion; or wherein the opposite edges of the first surface of the substrate are provided with a first protruding part respectively, and the first conductive parts are disposed at the first protruding part.

Another aspect of the present disclosure provides a power supply module assembly structure used in a smart terminal, including a system board and the aforesaid power supply module. The system board has first and second surfaces opposite to each other and an opening through the first surface and second surface of the system board, and a plurality of second conductive parts located at the system board, wherein the power passive element passes through the opening, and the first conductive parts of the substrate and the second conductive parts of the system board are fixed and electrically connected, such that the power supply module is electrically connected to the system board.

DETAILED DESCRIPTION

Now, the exemplary embodiments will be described more fully with reference to the accompany drawings. However, the exemplary embodiments can be implemented in various forms and should not be construed as limited to the embodiments set forth herein. Instead, these embodiments are provided so that this disclosure will be thorough and complete, and the concept of the exemplary embodiment will fully convey to those skilled in the art. For view of clarity, thickness of the area and the layer may be exaggerated. Same reference signs denote the same or similar structures in the accompany drawings, and thus the detailed description thereof will be omitted.

Furthermore, the described features, structures, or characteristics may be incorporated into one or more embodiments in any suitable manner. Hereinafter, numerous specific details are provided such that the embodiments of the present disclosure will be understood sufficiently. However, it should be appreciated for the person skilled in the art that the technical solution of the present disclosure may be implemented without one or more of specific details, or other methods, elements, materials, and the like may be employed. Under other circumstances, the well-known structures, materials, or operations are not shown or described to avoid obscuring the major technical idea of the present disclosure.

Figure 1A:
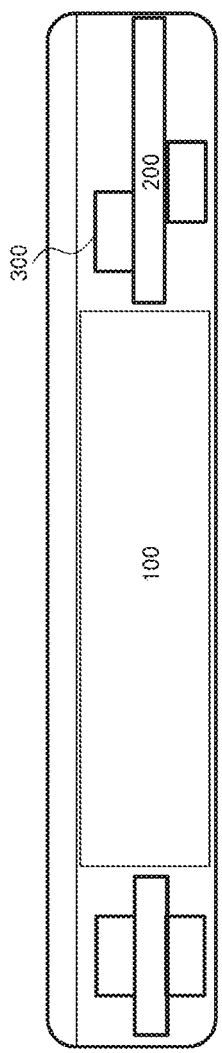
FIG. 1A is a schematic view of a power supply module in related art applied to a mobile phone.
Figure 1B:
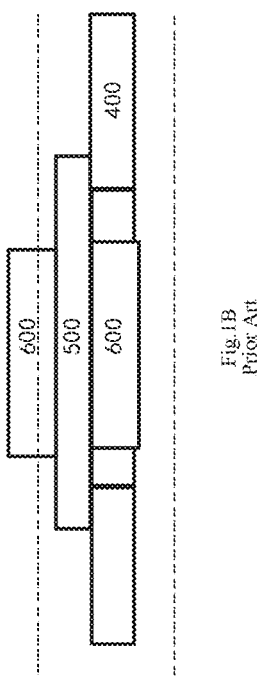
FIG. 1B is a schematic view of a power supply module in related art.
Figure 2:
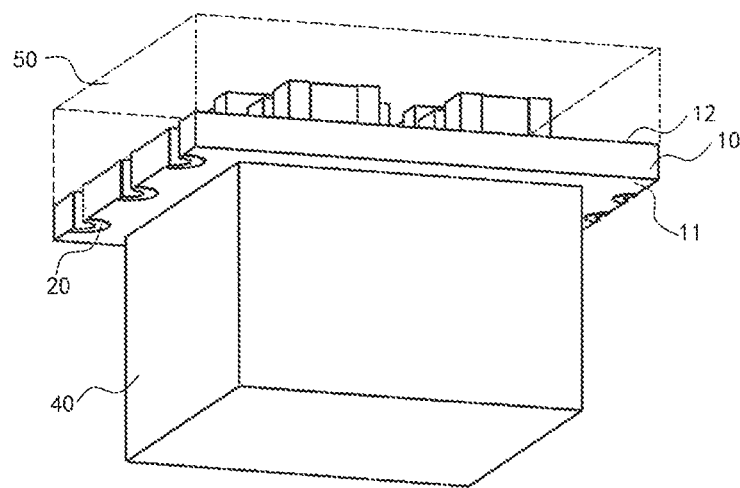
FIG. 2 is a perspective view of a power supply module applied to a smart terminal according to one embodiment of the present disclosure.
Figure 3:
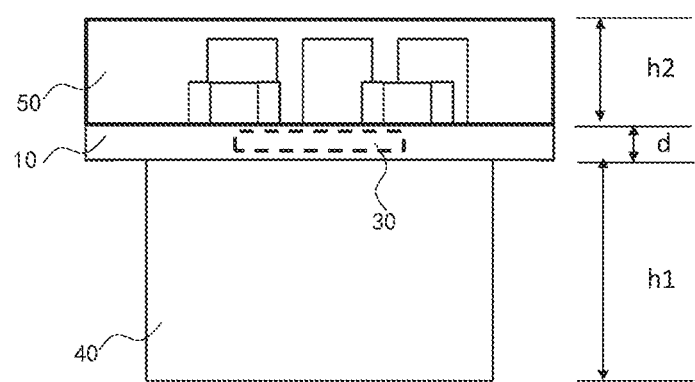
FIG. 3 is a front view of the power supply module applied to the smart terminal according to one embodiment of the present disclosure.
Figure 4:
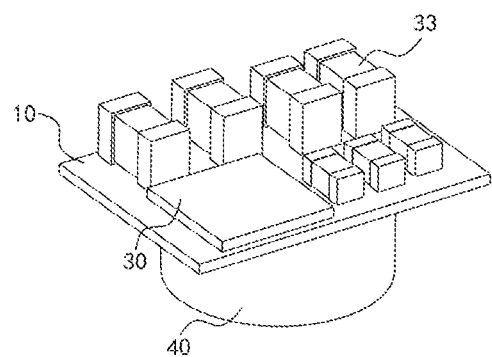
FIG. 4 is a perspective view of the power supply module applied to the smart terminal according to one embodiment of the present disclosure.

The present disclosure provides a power supply module used in a smart terminal (or maybe named intelligent terminal). As shown in FIG. 2 to FIG. 4, the power supply module includes a substrate 10 having a first surface 11 and a second surface 12 opposite to each other. In FIG. 2, the first surface 11 is the lower surface of the substrate 10, and the second surface 12 is the upper surface of the substrate 10.

The substrate 10 is provided with active element 30, power passive element 40, a plurality of first conductive parts 20 and other elements.

Wherein, the power passive element 40 is independently disposed on the first surface 11 of the substrate 10 as a whole.

As shown in FIG. 3, a maximum height of the power passive element disposed on the first surface 11 of the substrate 10 is h1, a maximum height of the elements disposed on the second surface 12 of the substrate 10 is h2, and a thickness of the substrate 10 is d. In the present disclosure, the maximum height of the power passive element disposed on the first surface 11 of the substrate 10 is greater than a sum of the maximum height of the elements disposed on the second surface 12 of the substrate 10 and an half of a thickness of the substrate 10, that is $h1 > h2 + d/2$.

The height of the power passive element 40 accounts for more than half of the total height of the power supply module, which optimizes the structure of the power supply module, and makes the space distribution more reasonable. The present disclosure may provide a space as large as possible for the power passive element 40, which advantageously improves the power of the power supply module.

Figure 5:
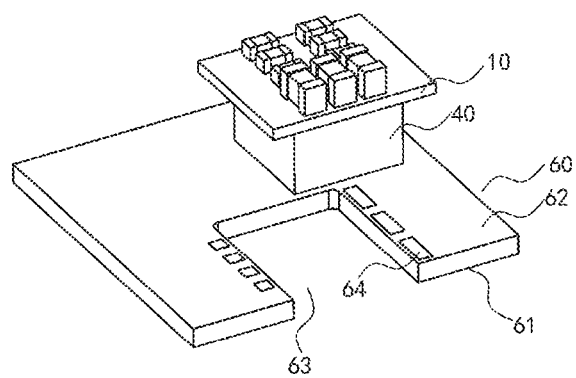
FIG. 5 is an exploded view of a power supply module assembling structure applied to the smart terminal according to one embodiment of the present disclosure.
Figure 6:
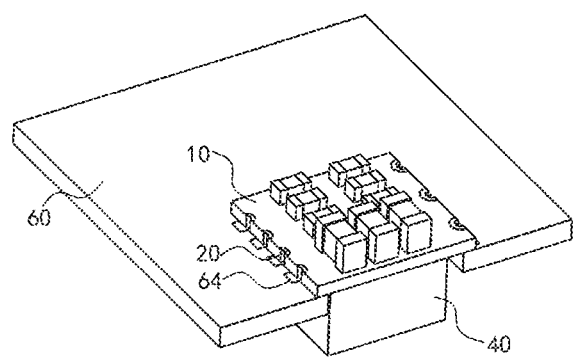
FIG. 6 is an assembled view of a power supply module assembling structure applied to the smart terminal according to one embodiment of the present disclosure.
Figure 7:
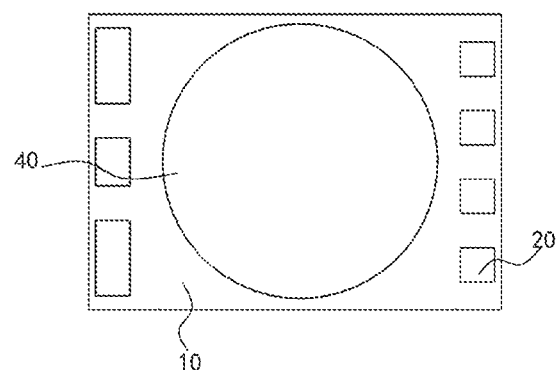
FIG. 7 is a bottom view of a power supply module applied to the smart terminal according to one embodiment of the present disclosure.

The power supply module of the present disclosure may be assembled with a system board to form a power supply module assembly structure for the smart terminal. Specifically, as shown in FIG. 5 and FIG. 6, the system board 60 has a first surface 61 and a second surface 62 opposite to each other, an opening 63 penetrating through the first surface 61 and the second surface 62 of the system board 60, and a plurality of second conductive parts 64 arranged on the system board 60, wherein the power passive element 40 may pass through the opening 63, and the first conductive parts 20 of the substrate 10 are fixed on and electrically connected to the second conductive parts 64 of the system board 60, such that the power supply module is electrically connected to the system board 60.

Since the height of the power passive element 40 accounts for more than half of the total height of the power supply module, the volume of the power passive element 40 can be increased as much as possible in the narrow space of the smart terminal in such way. So the power supply module of the present disclosure may be assembled with the system board 60 to better utilize of the upper and lower spaces of the system board 60, and avoid space waste, to meet the needs for various smart terminals, such as the mobile phone, and thereby having great practicality and economic value.

In various embodiments of the present disclosure, the power passive element 40 refers to a passive device with characteristics of energy conversion or energy storage in a power conversion circuit, rather than a passive device that merely plays a function of ripple smoothing filter. Wherein, an AC component (peak-to-peak value) in the power passive element 40 is greater than 50% of a DC component.

In some embodiments of the present disclosure, the power passive element 40 may be an energy storage device or a transformer. The energy storage device, for example, but not limited to, comprises a conductor, an energy storage medium, and pins. The conductor refers to the conductive part of the energy storage device, for example, a winding in an inductor or a transformer, and a conductive layer in a capacitor. The energy storage medium of the power passive element 40 can store electric energy or a magnetic energy, such as a magnetic core in the inductor or the transformer, or a dielectric in the capacitor. Wherein, the energy storage mediums (for example, the magnetic core) of the power passive element 40 are integrality located on the first surface 11 of the substrate 10. The pins of the power passive element 40 are terminals to connected with other devices. For example, the energy storage device may be an inductor, a capacitor or a battery, etc.

In some embodiments, the power passive element 40 may be an output inductor in a buck circuit, a capacitor in a switching capacitor circuit, or an inductor or a capacitor involved in power conversion in the circuits, such as a Cuk, buck, boost, buckboost, flyback, or switching capacitor, or a transformer in an LLC circuit.

It should be understood that the power passive element 40 may also be other auxiliary power supply modules or devices with energy storage characteristics.

Figure 32A:
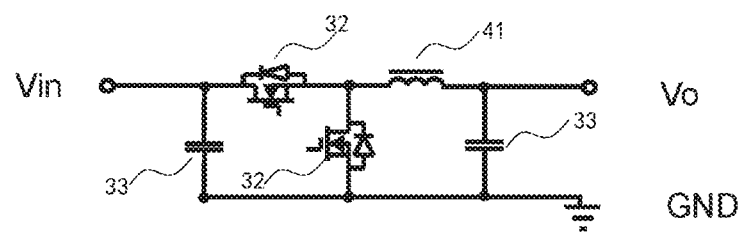
FIG. 32A to FIG. 32C are a schematic view of an application circuit-buck circuit, a schematic view of an application circuit-switching capacitor circuit, and a schematic view of an application circuit-LLC circuit, respectively.

Specifically, referring to FIG. 4 and FIG. 32A, in this embodiment, the power supply module takes a buck circuit for example, the active element 30 is a switching device 32, and the power passive element 40 is an inductor 41 which is disposed on the first surface 11 of the substrate 10, and the other components are, for example, an input and output filter capacitor 33 and so on. Alternatively, referring to FIG. 32B, in this embodiment, the power passive element 40 includes a capacitor 42 in the switching capacitor circuit. Alternatively, referring to FIG. 32C, in this embodiment, the power passive element 40 includes a transformer 43 in the LLC circuit. Wherein, in FIG. 32A, FIG. 32B, and FIG. 32C, Vin represents an input voltage, Vo represents an output voltage, and GND represents ground.

Further, the active element 30 includes a switching device and/or a controlling device. In some embodiments, the active element 30 may be embedded into the substrate 10, as shown in FIG. 3, which is advantageous to reduce the overall height of the power supply module and to save surface space of the substrate 10 to mount other components, so as to improve the integration, simplify the structure, reduce the size, and improve efficiency of the power supply module. Furthermore, the controlling device may also be integrated with the switching device 32.

In some other embodiments, as shown in FIG. 4, the active element 30 may be disposed on the second surface 12 of the substrate 10, to reduce process difficulty or decrease the thickness of the substrate 10. Alternatively, the active element 30 may also be disposed on the first surface 11 of the substrate 10, for example, the active element 30 is located between the first surface 11 of the substrate 10 and the power passive element 40.

Other components may also include resistances, filter capacitors, or other passive components. Other components of the power supply module may be disposed on the second surface 12 or may be embedded in the substrate 10.

In addition to the power passive element 40, other components may also be placed on the first surface 11 of the substrate 10 depending on the space of actual situation.

In one embodiment, the power supply module may further include a first shielding structure (not shown) which is disposed on the first surface 11 and envelops the power passive element 40. And the first shielding structure may be an electromagnetic shielding, which is installed at the surface of the power passive element 40 by means of electroplating or assembling, etc., to reduce electromagnetic interference of the power supply module to peripheral circuits or devices.

In one embodiment, the power supply module may further include a second shielding structure, as shown in FIG. 2 and FIG. 3, which is disposed on the second surface 12 and envelops all the components on the second surface 12, to improve the EMC characteristics of the power supply module.

In one embodiment, all of the components on the second surface 12 are packaged or embedded or molded on the second surface 12 of the substrate 10 by molding compound 50 (as shown by the dashed line in FIG. 2 or as shown in FIG. 3), so as to improve reliability of the module and facilitate for capturing the power supply module during SMT, and for the aesthetic purpose.

In the present disclosure, the power passive element 40 passes through the opening 63 of the system board 60, and the first conductive parts 20 of the substrate 10 are electrically and mechanically connected to the corresponding second conductive parts 64 of the system board 60. The first conductive parts 20, the second conductive parts 64, and the connections thereof will be described in detail below in the various embodiments.

In one embodiment, as shown in FIG. 5 to FIG. 10, the first conductive parts 20 are disposed at the edges of the two opposite sides of the substrate 10, and the second conductive parts 64 corresponding to the first conductive parts 20 are disposed at the edges of the two opposite sides of the opening 63 of the second surface 62 of the system board 60. When assembling the power supply module and the system board 60, the power passive element 40 passes through the opening 63 of the system board 60, the first conductive parts 20 of the substrate 10 are electrically and mechanically connected to the second conductive parts 64 on the system board 60 by means of the soldering, such as SMT and reflow. By this way, under the application that the spaces above and below the system board 60 are narrow or very limited, the high-power power supply module can be installed in the system board simply, and the connection is reliable.

In this embodiment, the first conductive parts 20 are disposed at the edges of the two opposite sides of the substrate 10. It should be understood that the first conductive parts 20 may also be disposed at the edges of the two adjacent sides of the substrate 10, or may also be disposed at the edge(s) of one, three or four sides.

Figure 8:
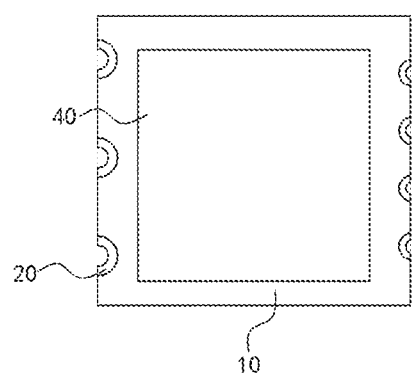
FIG. 8 is a bottom view of a power supply module applied to the smart terminal, according to one embodiment of the present disclosure.

Further, the first conductive parts 20 may be a soldering pad in the form of a "stamp hole", as shown in FIG. 6 and FIG. 8. The structure is compact, and the soldering result or welding condition of the power supply module on the system board 60 may be visually inspected through the "stamp hole".

Figure 9:
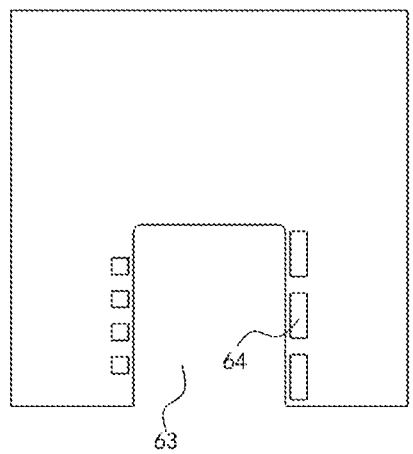
FIG. 9 and FIG. 10 show two embodiments of a system board of the power supply module assembling structure, respectively.
Figure 10:
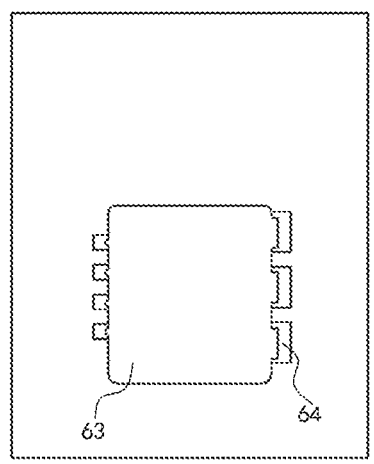

Wherein, the opening 63 of the system board 60 may be a slot not closed as shown in FIG. 9, or may be closed slot as shown in FIG. 10. And the second conductive parts 64 may also be soldering pads in the form of a "stamp hole", as shown in FIG. 10.

Figure 11:
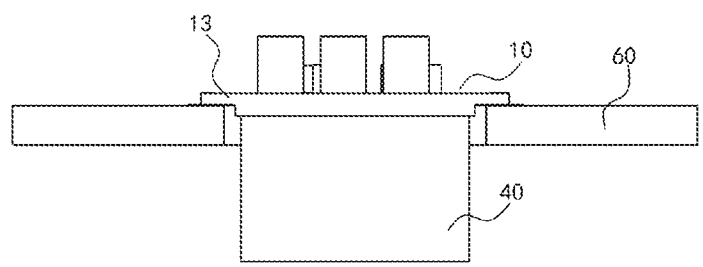
FIG. 11 is an assembled view of the power supply module assembling structure applied to the smart terminal according to one embodiment of the present disclosure, wherein a substrate has a first recessed portion.
Figure 12:
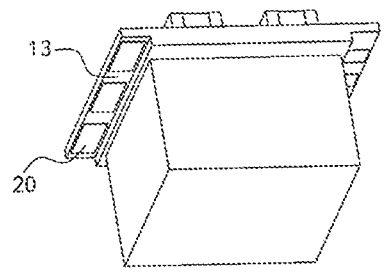
FIG. 12 is a perspective view of a power supply module in the power supply module assembling structure as shown in FIG. 11.
Figure 13:
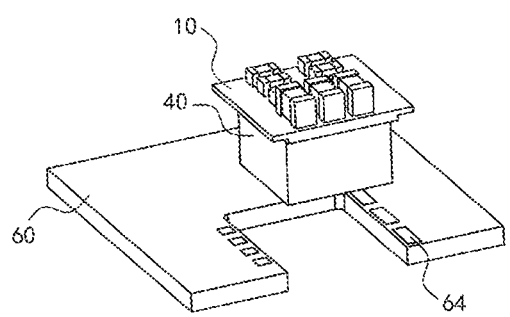
FIG. 13 is an exploded view of the power supply module assembling structure as shown in FIG. 11.

In one embodiment, as shown in FIG. 11 to FIG. 13, the edges of the substrate 10 is arranged in a stepped shape to adjust the relative positional relationship between the power supply module and the system board 60 in the height direction. Specifically, as shown in FIG. 11, the two opposite edges of the first surface 11 of the substrate 10 is provided with a first recessed portion 13, and the first conductive parts 20 are disposed at the first recessed portion 13. When assembling, the substrate 10 may be partially placed in the opening of the system board 60, to decrease the relative distance between the second surface 12 of the substrate 10. i.e., the upper surface, and the second surface 62 of the system board 60, i.e., the upper surface. The protruded height of the power module on system board can be reduced. And the process is simple and no special requirements needed for the system board 60.

Figure 14:
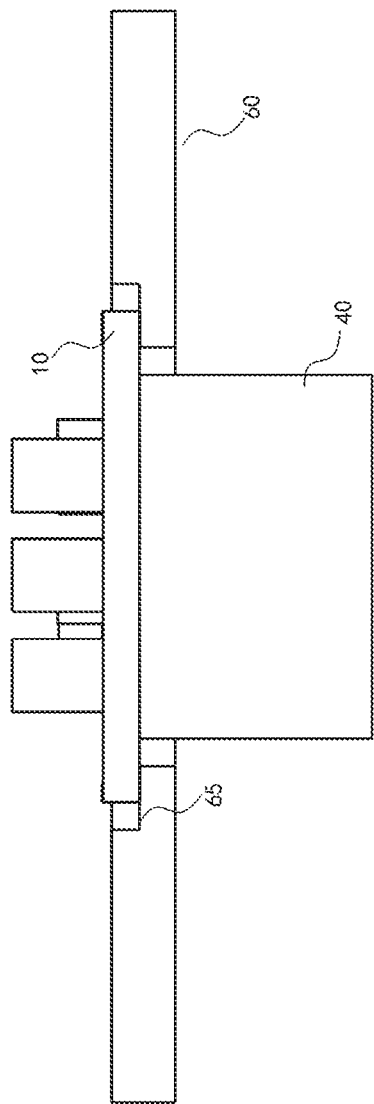
FIG. 14 is an assembled view of the power supply module assembling structure applied to the smart terminal according to one embodiment of the present disclosure, wherein the system board has a second recessed portion.

In one embodiment, as shown in FIG. 14, the edge of the opening 63 of the system board 60 is provided with a second recessed portion 65 recessed from the second surface 62 of the system board 60, and the second conductive parts 64 of the system board 60 are disposed at the second recessed portion 65. The second recessed portion 65 supports the substrate 10 of the power supply module, such that the substrate 10 is at least partially placed in the second recessed portion 65. The relative distance between the substrate 10 and the system board 60 may be adjusted when assembling. The protruded height of the power module on system board can be reduced. Such design may have further advantages for the power supply module with the thinner substrate 10 and thicker system board 60, and does not need any special process for the substrate 10.

Figure 15:
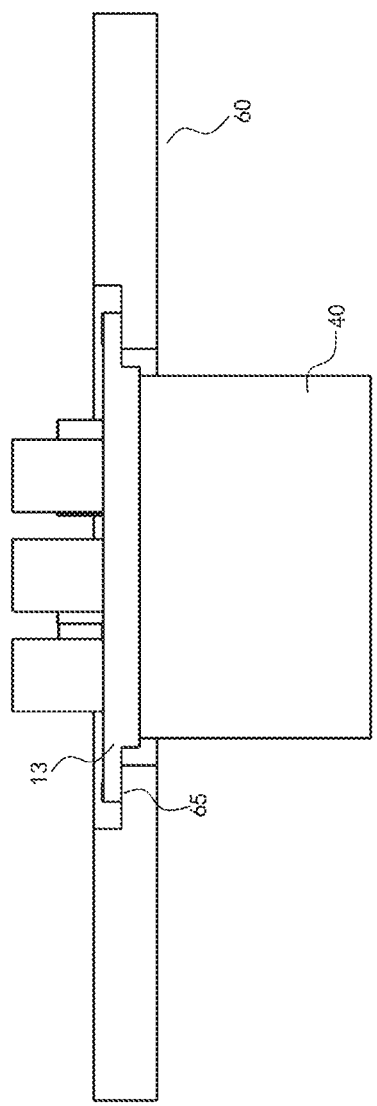
FIG. 15 is an assembled view of the power supply module assembling structure applied to the smart terminal according to one embodiment of the present disclosure, wherein the substrate has a first recessed portion, and the system board has a second recessed portion.

In one embodiment, as shown in FIG. 15, the edge of the first surface 11 of the substrate 10 is provided with the first recessed portion 13, and the edge of the opening 63 of the system board 60 is provided with the second recessed portion 65. The electrically and mechanically connection between the first recessed portion 13 and the second recessed portions 65 may achieve position adjustment between the power supply module and the system board 60 in a longitudinal direction (the height direction) to a greater extent, and the overall height of the power supply module assembly structure can be further reduced.

Figure 16:
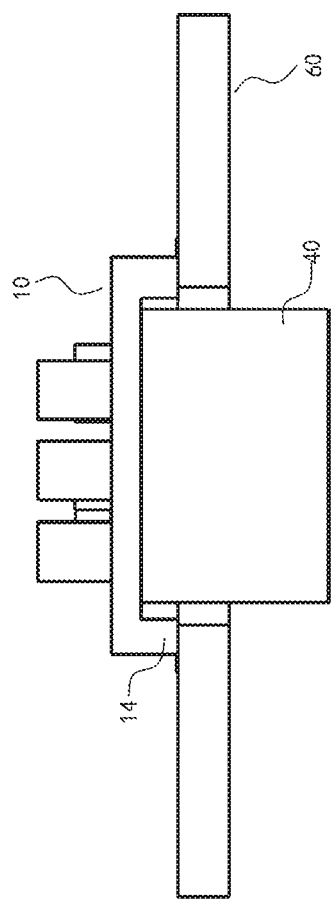
FIG. 16 and FIG. 17 are assembled views of the power supply module assembling structure applied to the smart terminal according to one embodiment of the present disclosure, wherein the substrate has a first protruding portion.
Figure 17:
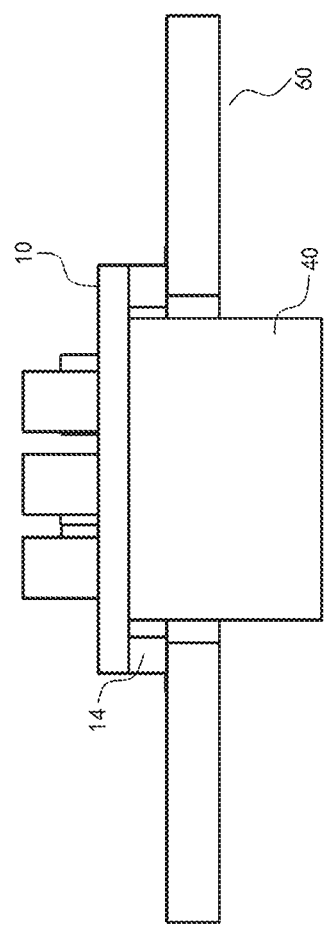
Figure 18:
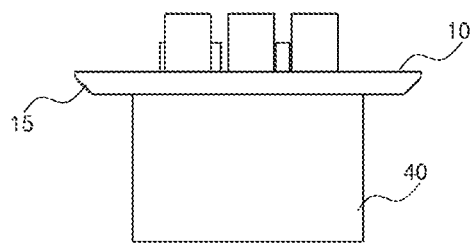
FIG. 18 is a front view of the power supply module according to one embodiment of the present disclosure, wherein the substrate has an inclined surface.
Figure 19:
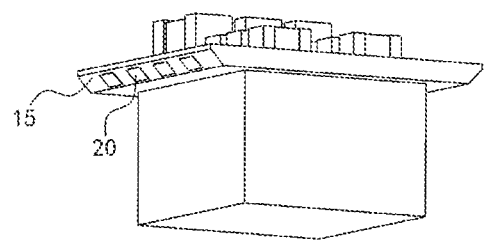
FIG. 19 is a perspective view of the power supply module as shown in FIG. 18.
Figure 20:
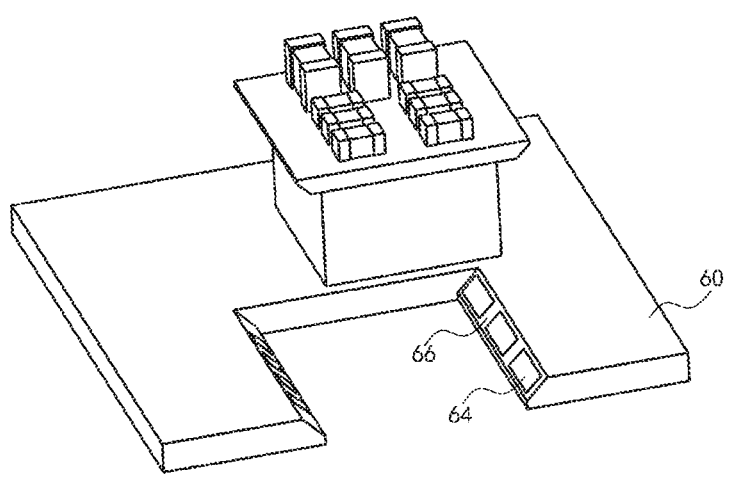
FIG. 20 is an exploded view of the power supply module assembling structure applied to the smart terminal according to one embodiment of the present disclosure, wherein the substrate and the system board have inclined surfaces.
Figure 21:
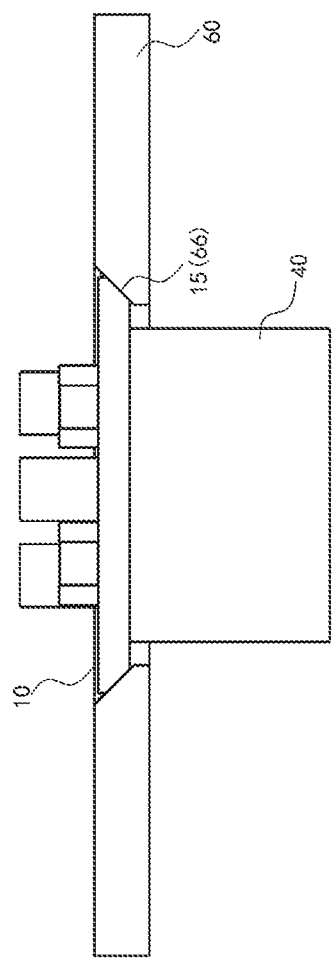
FIG. 21 is a front view of the power supply module assembling structure as shown in FIG. 20.

In one embodiment, as shown in FIG. 16 and FIG. 17, the two opposite edges of the first surface 11 of the substrate 10 is provided with a first protruding part 14. The first conductive parts 20 may be disposed on the first protruding part 14. The first protruding part 14 is integrally formed with the substrate 10, as shown in FIG. 16; or the first protruding part 14 is separate part and assembled to the substrate 10, as shown in FIG. 17. In this embodiment, the first protruding part 14 is disposed at the two edges of the substrate 10 to form a convex step, to increase the relative distance between the substrate 10 and the system board 60, and a larger space may be obtained for the power passive element 40, which can improve the power of the power supply module, and the process is simple, and does not require special processing on the system board 60.

In one embodiment, as shown in FIG. 18 to FIG. 21, the first surface 11 of the substrate 10 is retracted relative to the second surface 12 to form an inclined surface 15 at the edge of the substrate 10, and the first conductive parts 20 are disposed at the inclined surface 15 of the substrate 10. Correspondingly, the edge of the opening 63 of the system board is arranged to an inclined surface 66 in cooperation with the edge of the substrate 10, such that the first surface 61 at the opening 63 extends into the opening relative to the second surface 62, and the second conductive parts 64 are disposed at the inclined surface 66 of the system board 60.

Therefore, the power passive element 40 passes through the opening 63 on the system board 60, and the first conductive parts 20 are correspondingly electrically connected (maybe soldered such as through SMT and reflow process) to the second conductive parts 64 with the match of the inclined surface 15 of the substrate 10 and the inclined surface 66 of the system board 60. Wherein, the relative position between the substrate 10 and the system board 60 may be adjusted by adjusting the tilt angle of the inclined surface, so the relative position in the height direction of the power supply module to the system board can be adjusted and the size of the power passive element in the height direction can be adjusted.

Further, the method of inclined surface matching has various advantages: the relative position between the substrate 10 and the system board 60 may be arbitrarily adjusted within a certain range. The first conductive parts 20 and the second conductive parts 64 are respectively disposed at the inclined surfaces of the substrate 10 and the system board 60, which reduces footprint of the power supply module. Such connection is similar to combination of the method of SMT and DIP, and the connection is highly reliable and compact.

Figure 22:
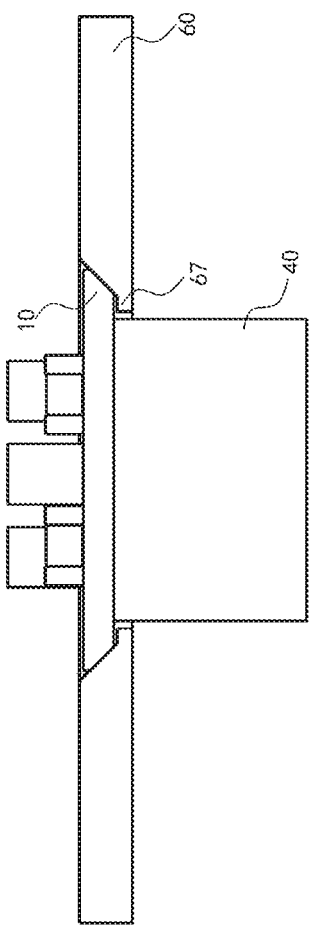
FIG. 22 is an assembled view of the power supply module assembling structure applied to the smart terminal according to one embodiment of the present disclosure, wherein the substrate and the system board have an inclined surface, and the system board further includes a step portion.

Further, as shown in FIG. 22, the system board 60 may further include a step portion 67 that is located between the inclined surface 66 and the opening 63. The step portion 67 protrudes to the opening 63 in a horizontal direction from the inclined surface, so that the portion of first surface 11 of the substrate 10 close to the inclined surface 15 maybe supported on the step portion 67. The protruded step portion 67 may help keep the power supply module balanced and aligned during the process of assembling the power supply module and the system board 60, to prevent the power supply module from skewing.

Figure 23:
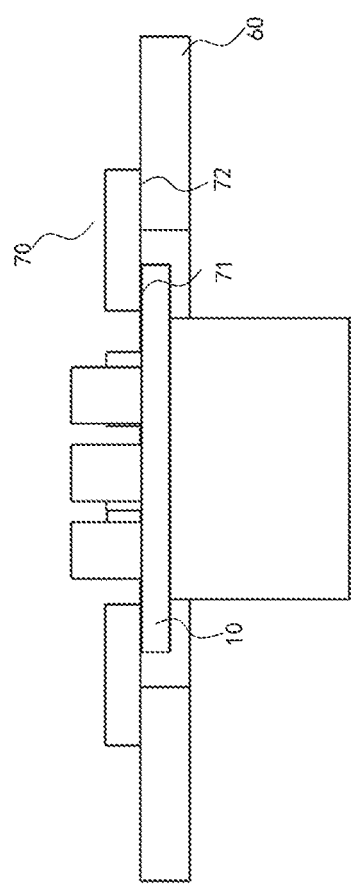
FIG. 23 to FIG. 26 are assembled views of the power supply module assembling structure applied to the smart terminal according to one embodiment of the present disclosure, wherein the power supply module has a connector.

In one embodiment, as shown in FIG. 23, the power supply module may further have a connecting member 70. The connecting member 70 is a conductor. The connecting member 70 has a plurality of first connecting parts 71 on one side and a plurality of second connecting parts 72 on the other side. The first connecting parts 71 are electrically connected to the first conductive parts 20 of the substrate 10, and the second connecting parts 72 are electrically connected to the second conductive parts 64 of the system board 60, such that the substrate 10 and the system board 60 are fixed and electrically connected. The first connecting parts 71 may be connected to the first conductive parts 20 by means of the SMT or the DIP. The second connecting parts 72 may be connected to the second conductive parts 64 of the system board 60 by means of the SMT or the DIP.

In one embodiment, the connecting member 70 is in the shape of flat plate, such as a copper piece or leadframe, as shown in FIG. 23. Both the first connecting parts 71 and the second connecting parts 72 are solder pads, and are located at the lower surface of the connecting member 70. Wherein, in this embodiment, the first conductive parts 20 are disposed on two opposite sides of the second surface 12 of the substrate 10. The first conductive parts 20 of the substrate 10 is connected with the first connecting parts 71, and the second conductive parts 64 of the system board 60 is connected with the second connecting part 72 by the connecting member 70 with means of the SMT, so that the upper surface of the substrate 10 is coplanar with the upper surface of the system board 60.

Figure 24:
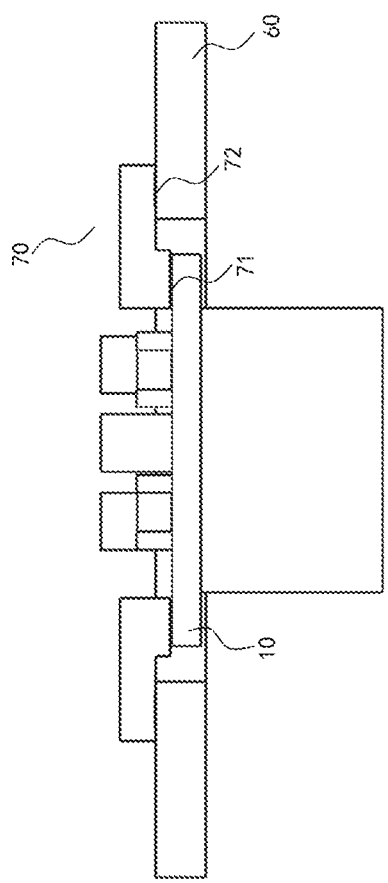

In one embodiment, as shown in FIG. 24, the connecting member 70 is stepped shaped, for example, a copper piece having a stepped shape. One side of the connecting member 70 is protruded from the other side of the connecting member 70. The connecting member 70 connects the substrate 10 with the system board 60 electrically and mechanically by means of the SMT, such that the relative position in the height direction between the substrate 10 and the upper surface of the system board 60 may be adjusted.

Figure 25:
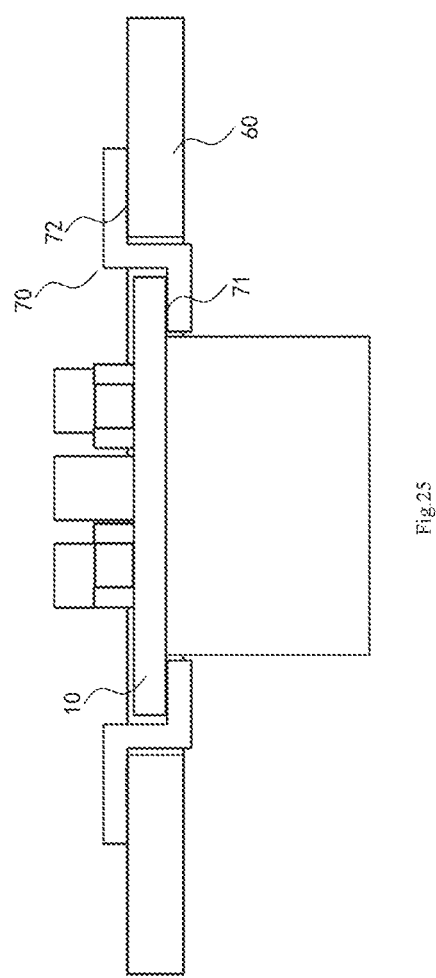

In one embodiment, as shown in FIG. 25, the connecting member 70 is a substantially Z-shaped connecting member. The first connecting parts 71 are located on the upper surface of one side of the Z-shaped connecting member, and the second connecting parts 72 are located at the lower surface of the other side of the Z-shaped connecting member, such that the Z-shaped connecting member makes the connection between substrate 10 and system board 60 more reliable, for example, there is no risk of detachment during reflow and use.

Figure 26:
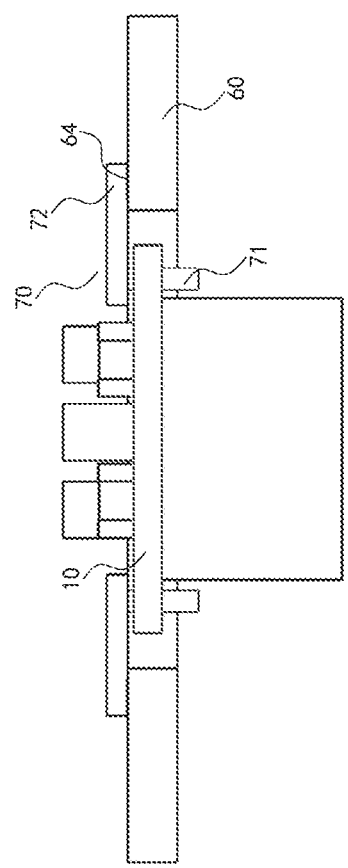

In one embodiment, as shown in FIG. 26, the first connecting parts 71 are pins, so the substrate 10 is connected to the system board 60 by means of the DIP. The second connecting parts 72 are soldering pads, and are connected to the second conductive parts 64 of the system board 60 by means of the SMT. The combination of the SMT and the DIP in this embodiment ensures the connection more reliable and application more flexible. Depending on the actual application, the first connection portion 71 may be soldering pads and connected to the power supply module by means of the SMT. The second connecting parts 72 may be pins and connected to the system board by means of the DIP. Alternatively, both the first connecting parts 71 and the second connecting parts 72 are pins, and the substrate 10 is connected to the system board 60 by means of the DIP.

Figure 27:
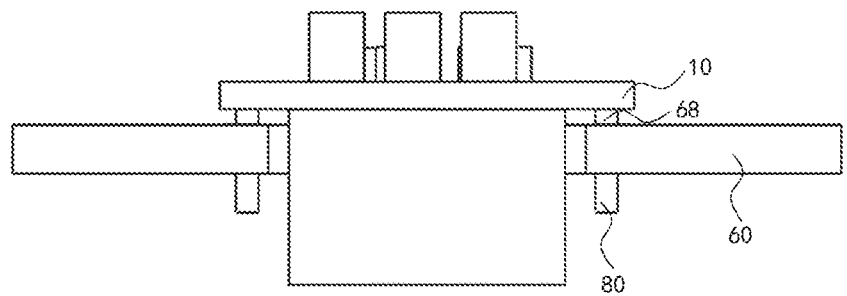
FIG. 27 is an assembled view of the power supply module assembling structure applied to the smart terminal according to one embodiment of the present disclosure, wherein the substrate may further include a positioning element.

In one embodiment, as shown in FIG. 27, the power supply module may further include a positioning element 80, such as a positioning pin, which is protruded at the opposite sides of the first surface 11 of the substrate 10. A positioning hole 68 is provided at the opposite sides of the system board 60 correspondingly, which penetrates through the first surface 61 and the second surface 62 of the system board 60. The positioning element 80 is matched with the positioning hole 68 such that the substrate 10 is fixed and connected to the system board 60. In this embodiment, the positioning element 80 cooperates with the corresponding positioning hole 68 of the system board 60, which can better restrict the relative positional relationship between the power supply module and the system board 60, and make the installation of the power supply module and the system board 60 more accurate.

Figure 28:
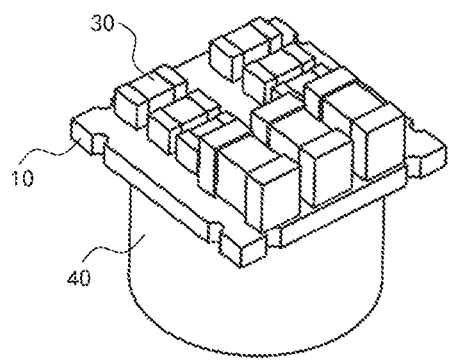
FIG. 28 is a perspective view of the power supply module applied to the smart terminal according to one embodiment of the present disclosure.
Figure 29:
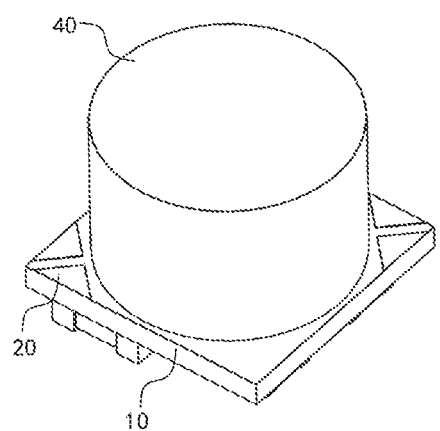
FIG. 29 and FIG. 30 are other perspective views of the power supply module as shown in FIG. 28, showing two first conductive parts, respectively.
Figure 30:
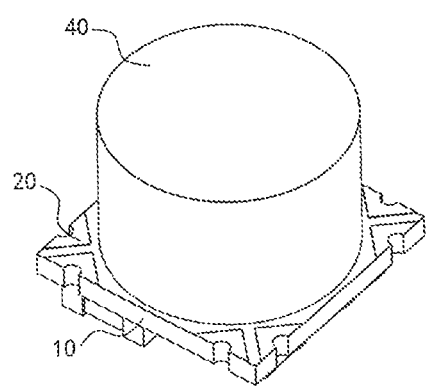
Figure 31:
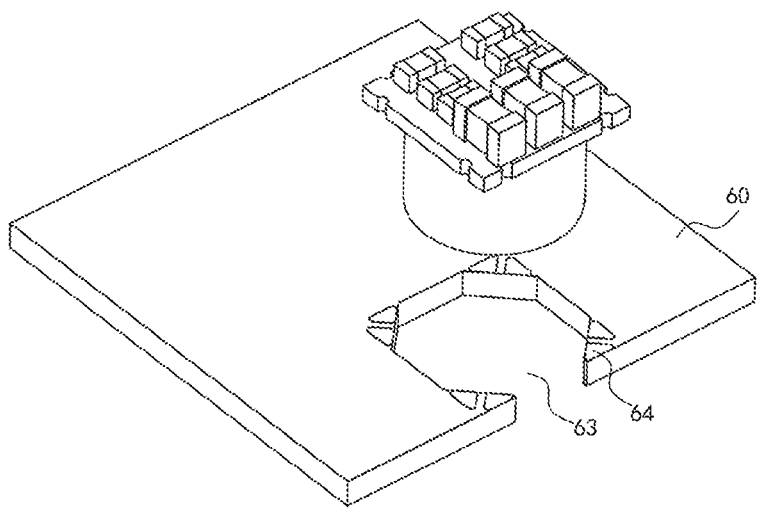
FIG. 31 is an exploded view of the power supply module assembling structure applied to the smart terminal according to one embodiment of the present disclosure, including the power supply module as shown in FIG. 28.

In one embodiment, as shown in FIG. 28 to FIG. 30, the power passive element 40 is cylindrical, and is centrally disposed on the first surface 11, such that the four corners of the first surface 11 have larger space to arrange the first conductive parts 20. Correspondingly, the second conductive parts 64 are disposed at the four corners of the opening 63 of the system board 60, as shown in FIG. 31, so that the opening 63 of the system board 60 is octagonal. In this embodiment, the four corners of the first surface 11 of the substrate 10 and the four corners of the opening 63 of the system board 60 are all free space which may be effectively utilized by setting the conductive parts at the corner. The overall footprint of the power supply module is decreased and the stability of connection between substrate 10 and system board 60 may be ensured, and the module power density may be improved.

In this embodiment, as shown in FIG. 29, the first conductive parts 20 are conventional soldering pads and are disposed on at least two corners of the substrate 10. Alternatively, the first conductive parts 20 are pads in the form of the "stamp hole", as shown in FIG. 30, to improve soldering quality and inspection.

In this embodiment, both the first conductive parts 20 and the second conductive parts 64 are triangular. It should be understood that the shape and number of the first conductive parts 20 and the second conductive parts 64 are not limited thereto, for example, a square shape, a circular shape, or the like, may be disposed on one, or two diagonally, or three corners.

In other embodiments, the power passive element 40 may also be an octagonal cylinder that matches with the shape of the opening 63 of the system board 60 as shown in FIG. 31. Alternatively, the opening 63 of the system board 60 may also be circular, and the opening 63 may also be closed or not closed as described above.

Figure 32B:
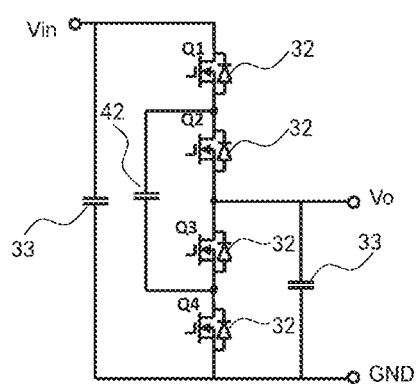
Figure 32C:
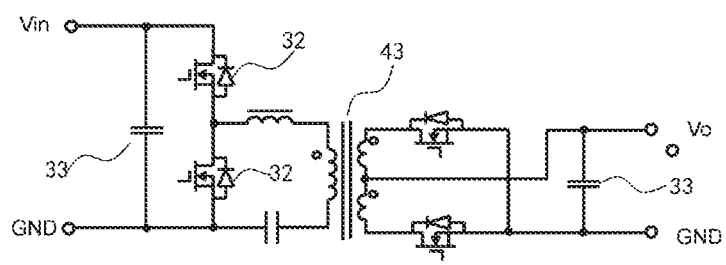

The present embodiment may be applied to the related circuits as shown in FIG. 32A to FIG. 32C, but is not limited thereto. And glue maybe filled between the power supply module and the system board 60 to strengthen the connection between the power supply module and the system board 60.

As above described, the power passive element of the present disclosure is independently disposed on one surface of the substrate as a whole, which can make the power supply module compact, and improve PCB utilization and power density, and is facilitated for production development and modular manufacture. The height of the power passive element accounts for more than half of the total height of the power supply module, so that the power supply module of the present disclosure may be assembled with the system board to better utilize the space and avoid space waste. Thereby, the power supply module with high power of the present disclosure is designed, which can be mounted under the circumstance of narrow space of the smart terminal, to improve the power of power supply module greatly to meet the diversified needs of smart terminals such as mobile phones.

Although the present disclosure has been described with reference to a few of exemplary embodiments, it should be understood that all the terms used are illustrative and exemplary, and nonrestrictive. As the present disclosure may be embodied in a variety of forms without departing from the spirit or scope of the invention, it is to be understood that the above-described embodiments are not limited to any foregoing detail. All changes and modifications within the scope of the claims or their equivalents are intended to be embraced by the appended claims.

What is claimed is:

1. A power supply module used in a smart terminal, comprising:
    a substrate having first and second surfaces opposite to each other;
    a power passive element, an active element and a plurality of first conductive parts disposed at the substrate;
    the power passive element being independently disposed on the first surface of the substrate as a whole;
    wherein a maximum height of the power passive element disposed on the first surface of the substrate is greater than a sum of a maximum height of any element disposed on the second surface of the substrate and a half of the thickness of the substrate;
    wherein the first conductive parts are disposed at at least two sides of the first surface of the substrate;
    wherein the at least two sides of the first surface of the substrate are provided with a first recessed portion respectively, and the first conductive parts are disposed at the first recessed portion.

2. The power supply module used in a smart terminal according to claim 1, wherein the power passive element comprises an energy storage device or a transformer.

3. The power supply module used in a smart terminal according to claim 1, wherein all components on the second surface of the substrate are molded on the second surface of the substrate.

4. The power supply module used in a smart terminal according to claim 1, wherein the power supply module further has a second shielding structure, and the second shielding structure is disposed on the second surface and envelopes all components on the second surface.

5. The power supply module used in a smart terminal according to claim 1, wherein the first conductive parts are soldering pads.

6. The power supply module used in a smart terminal according to claim 5, wherein the first conductive parts are soldering pads in form of stamp hole.

7. The power supply module used in a smart terminal according to claim 1, wherein two opposite edges of the first surface of the substrate are provided with a first protruding part respectively, the first protruding part and the substrate are formed in one body or the first protruding part is detachably connected with the substrate.

8. A power supply module assembly structure used in a smart terminal, comprising a system board and a power supply module, the power supply module comprises:
    a substrate having first and second surfaces opposite to each other;
    a power passive element, an active element and a plurality of first conductive parts disposed at the substrate;
    the power passive element being independently disposed on the first surface of the substrate as a whole;
    wherein a maximum height of the power passive element disposed on the first surface of the substrate is greater than a sum of a maximum height of any element disposed on the second surface of the substrate and a half of the thickness of the substrate;
    the system board having first and second surfaces opposite to each other, an opening through the first and second surfaces of the system board, and a plurality of second conductive parts located at the system board;
    wherein the power passive element passing through the opening, and the first conductive parts of the substrate and the second conductive parts of the system board being fixed and electrically connected, such that the power supply module being electrically connected to the system board;
    wherein the second conductive parts are disposed at at least two sides of the opening of the second surface of the system board, and corresponds to the first conductive parts;
    wherein the first conductive parts are disposed at at least two sides of the first surface of the substrate;
    wherein the at least two sides of the first surface of the substrate are provided with a first recessed portion respectively, and the first conductive parts are disposed at the first recessed portion.

9. The power supply module assembly structure according to claim 8, wherein the first conductive parts are connected to the second conductive parts by means of the SMT.

10. The power supply module assembly structure according to claim 8, wherein the at least two sides of the opening of the system board is provided with a second recessed portion recessed from the second surface of the system board, and the second conductive parts are disposed at the second recessed portion, and the second recessed portion of the system board supports the substrate of the power supply module, such that the substrate is at least partially in the second recessed portion.

11. The power supply module assembly structure according to claim 8, wherein two opposite edges of the first surface of the substrate are provided with a first protruding part respectively, the first protruding part and the substrate are formed in one body.

12. The power supply module used in a smart terminal according to claim 1, wherein the power passive element is arranged between a first part of the first conductive parts and a second part of the first conductive parts.

13. The power supply module assembly structure according to claim 8, wherein the power passive element is arranged between a first part of the first conductive parts and a second part of the first conductive parts.

* * * * *